(12) United States Patent
Lee

(10) Patent No.: US 6,544,888 B2
(45) Date of Patent: Apr. 8, 2003

(54) ADVANCED CONTACT INTEGRATION SCHEME FOR DEEP-SUB-150 NM DEVICES

(75) Inventor: Brian S. Lee, Hsinchu (TW)

(73) Assignee: Promos Technologies, Inc., Hsinchu (TW)

(*) Notice: Subject to any disclaimer, the term of this patent is extended or adjusted under 35 U.S.C. 154(b) by 0 days.

(21) Appl. No.: 09/892,620

(22) Filed: Jun. 28, 2001

(65) Prior Publication Data
US 2003/0003640 A1 Jan. 2, 2003

(51) Int. Cl.[7] ............... H01L 21/44; H01L 21/425; H01L 21/8249
(52) U.S. Cl. .............. 438/659; 438/233; 438/511; 438/524; 438/530; 438/586; 438/682
(58) Field of Search ............... 438/659, 658, 438/682, 154, 199, 233, 511, 519, 524, 530, 546, 586

(56) References Cited

U.S. PATENT DOCUMENTS

| | | | |
|---|---|---|---|
| 4,485,550 A | * 12/1984 | Koeneke et al. | 257/382 |
| 4,597,163 A | * 7/1986 | Tsang | 148/DIG. 140 |
| 4,709,467 A | * 12/1987 | Liu | 257/350 |
| 4,784,973 A | * 11/1988 | Stevens et al. | 148/237 |
| 4,839,309 A | * 6/1989 | Easter et al. | 148/DIG. 123 |
| 4,945,070 A | * 7/1990 | Hsu | 148/DIG. 123 |
| 5,063,422 A | * 11/1991 | Hillenius et al. | 257/372 |
| 5,190,888 A | * 3/1993 | Schwalke et al. | 438/228 |
| 5,322,809 A | * 6/1994 | Moslehi | 148/DIG. 147 |
| 5,371,041 A | * 12/1994 | Liou et al. | 438/231 |
| 5,504,031 A | * 4/1996 | Hsu et al. | 438/533 |
| 5,510,296 A | * 4/1996 | Yen et al. | 117/8 |
| 5,536,684 A | * 7/1996 | Dass et al. | 438/586 |
| 5,618,756 A | * 4/1997 | Chew et al. | 438/586 |
| 5,641,707 A | * 6/1997 | Moslehi | 438/513 |
| 5,858,846 A | * 1/1999 | Tsai et al. | 438/303 |
| 5,882,965 A | * 3/1999 | Schwalke et al. | 257/369 |
| 5,888,888 A | * 3/1999 | Talwar et al. | 438/533 |
| 5,899,741 A | * 5/1999 | Tseng et al. | 438/630 |
| 6,159,874 A | * 12/2000 | Tews et al. | 438/243 |
| 6,242,312 B1 | * 6/2001 | Huang et al. | 438/305 |
| 6,274,472 B1 | * 8/2001 | Hossain et al. | 438/598 |
| 6,306,714 B1 | * 10/2001 | Pan et al. | 438/300 |
| 6,365,446 B1 | * 4/2002 | Chong et al. | 438/197 |

OTHER PUBLICATIONS

Wolf, "Silicon Processing for the VLSI ERA vol. 1", 1986, pp. 303–308.*

* cited by examiner

*Primary Examiner*—Matthew Smith
*Assistant Examiner*—Lex H. Malsawma
(74) *Attorney, Agent, or Firm*—Stevens, Davis, Miller & Mosher, LLP

(57) ABSTRACT

An advanced contact integration technique for deep-sub-150 nm semiconductor devices such as W/WN gate electrodes, dual work function gates, dual gate MOSFETs and SOI devices. This technique integrates self-aligned raised source/drain contact processes with a process employing a W-Salicide combined with ion mixing implantation. The contact integration technique realizes junctions having low contact resistance ($R_C$), with ultra-shallow contact junction depth ($X_{JC}$) and high doping concentration in the silicide contact interface ($N_c$).

10 Claims, 6 Drawing Sheets

US 6,544,888 B2

ADVANCED CONTACT INTEGRATION SCHEME FOR DEEP-SUB-150 NM DEVICES

BACKGROUND OF THE INVENTION

1. Field of the Invention

The present invention relates to the fabrication of semiconductor devices with self-aligned, raised source/drain.

2. Discussion of Related Art

The self-aligned contact (SAC) is widely known as a fabrication technique for reducing the cell size of memory units. Memory devices fabricated using SACs are commonly formed on the same CMOS chip as the logic circuits that address them.

Higher logic circuit performance is often obtained by using salicide (self-aligned silicide) processes. Anneal of a refractory metal layer causes the underlying silicon to react with the metal layer and produces a silicide overlying gate electrode and source and drain regions. These silicided regions have lower resistance than non-silicided regions. This is especially true of smaller geometries.

Silicidation is widely used in the art. As device design density shrinks for CMOS devices covering both deep trench dynamic random access memory (DT DRAM) and addressing logic, existing process integration schemes fail to meet contact requirements, especially as CMOS devices are scaled down to 150 nm node. Success of future CMOS process integration will largely depend on successful formation of healthy contacts that provide ultra-shallow contact junctions ($X_{JC}$) with low leakage and that also provide low contact resistance ($R_C$) and with high doping concentration in the silicide contact interface ($N_C$). Process integration also requires consideration of other critical process criteria such as cost, thermal budget, device impact, reliability, etc. However, there is presently no universal proposal to make an advanced contact meeting ultimate requirements due to complex interrelationships among these parameters, each having its own process integration steps.

SUMMARY OF THE INVENTION

Thus, there is a need for an integration scheme for formation of an advanced contact having characteristics of low $R_C$, high $N_C$, and shallow ($X_{JC}$), all of which are all essential for CMOS devices scaled down to sub-150-nm node. The present invention provides such an integration scheme that works for W/WN gate electrodes, Dual Work Function Gates, Dual Gate MOSFETs, and SOI devices, among others.

The integration scheme of the present invention enables the formation of contacts meeting these fundamental requirements (as discussed above) for CMOS devices covering both DT DRAM and logic. This scheme integrates formation of self-aligned raised contact window structures with a W-Salicide combined with an ion mixing implantation method. This method comprises the steps of:

1. forming conventional junctions;
2. performing an integrated bit line contact/source contact (CB/CS) etch;
3. performing surface amortization;
4. growing hemispherical grain/meta-stable poly (HSG/MSP) selectively; it should be noted that HSG and MSP can be interchangeably used.
5. depositing W selectively;
6. performing ion mixing;
7. annealing junction;
8. performing a dedicated contact to gate (CG) etch; and
9. performing a metal line and local tier process.

This integration scheme results in shallow junctions with low contact resistance for deep-sub-150 nm devices.

The present invention provides a method of integrating self-aligned raised contact processes with a W-Salicide combined with an ion mixing implantation method to render junctions with low contact resistance ($R_C$) that are ultra-shallow $X_{JC}$ and have high doping concentration in the interface ($N_c$).

DETAILED DESCRIPTION OF PREFERRED EMBODIMENTS OF THE INVENTION

Advanced metal silicon (MS) contacts require high doping to form low resistance ohmic contacts. At these heavily doped MS junctions, the electron emission (TE) is dominated by field emission (FE) and thermal-field emission (TFE), leading to higher contact conductivity. However, a very high surface concentration of dopants naturally leads to deeper junctions because of concentration dependent diffusion. This effect transiently increases following a high-energy implantation step due to the anomalous diffusion effect of transient enhanced diffusion (TED). This transient effect results from the thermal treatment (anneal) of the silicon that is necessary to activate the implanted ions (i.e., to move the dopant atoms to substitutional sites), and to remove residual implantation damage. In this way, the objective of low $R_C$ and shallow ($X_{JC}$) work against one another.

Furthermore, silicidation on heavily doped Si is often considerably more difficult than that of undoped Si.

To overcome these several effects, it is ideal to have an integration scheme which incorporates steps for (1) an elevated contact window to compensate for Si consumption during silicidation and junction diffusion into Si, (2) silicidation with a refractory metal (such as tungsten (W), cobalt (Co), and titanium (Ti) for ULSI processes) to assure a low resistance MS contact, and (3) controlled doping by an ion implantation method. During ion implantation, the implantation depth and doping level can be optimized independently. It is also beneficial to perform implantation through silicidation layers, in order to extend the high-energy implantation scheme.

Dopant can also be provided from the silicidation later in the process (silicide as doping source (SADS)), this relaxes the requirement for uniform silicide layers while still avoiding a short channel effect through shallow junction formation.

Figures 1A, 1B:
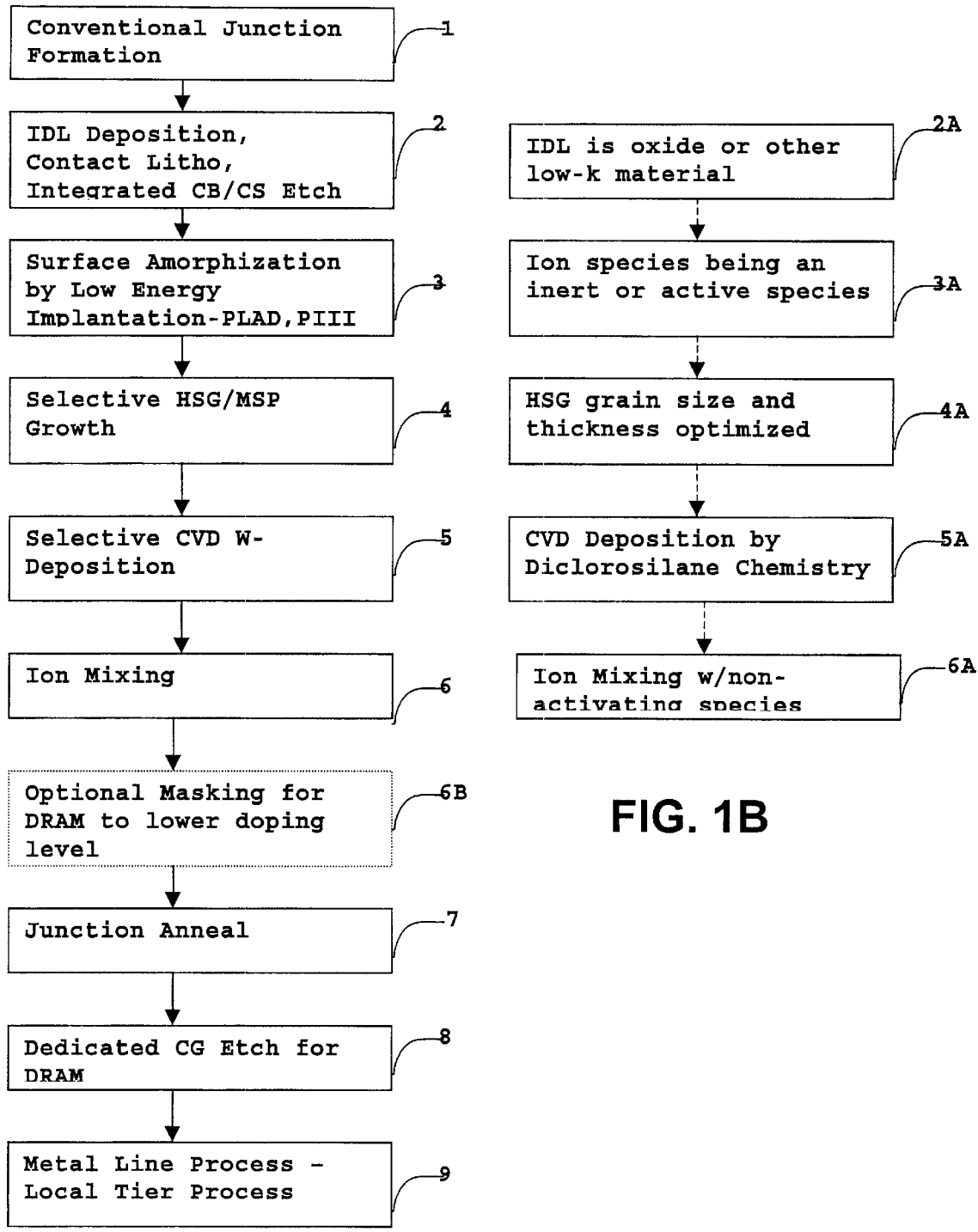
FIG. 1A is a flow diagram of a preferred embodiment of the present invention.
FIG. 1B is a flow diagram of an alternative embodiment of steps 2–6 of FIG. 1A.

Referring now to the drawings, and more particularly to FIGS. 1A and 1B, there are shown a flow diagram for a first embodiment (FIG. 1A) and an alternative embodiment (FIG. 1B) of the present invention, for concurrently achieving an elevated (or raised) contact window structure followed by a selective W silicidation step.

First, for the step in block 1, conventional junction formation is performed by lightly doping a drain area on the substrate 12, implanting drains 14 and sources 15, followed by an annealing step.

Figure 2:
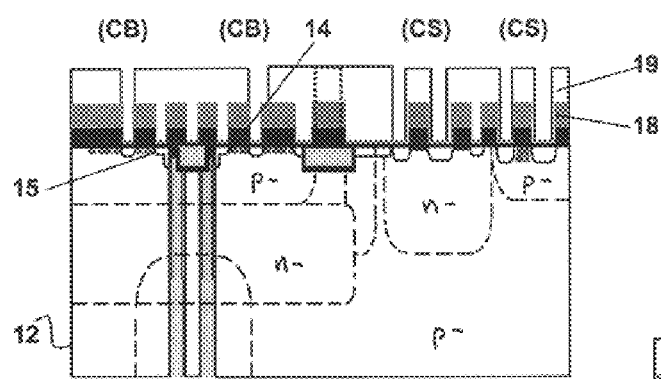
FIGS. 2–9 each illustrate cross sections of the inventive structure as it appears during the steps of the preferred inventive method illustrated in the flow diagram of FIG. 1A.

Then, for the step in block 2 illustrated in FIG. 2, interlevel dielectric layer (IDL) 18 deposition and S/D contact etch are performed. Integrated CB/CS etch (identical etch requirements) is performed for the DRAM case. A self-aligned contact (SAC) 19 etch process and de-coupling CS from contact to gate (CG) etch provides a wider process window. Tool/process commonality occurs between CS/CB and CG as well as independent optimization. Further, gate conductor (GC) is protected from CS-GC misalignment.

Figure 3:
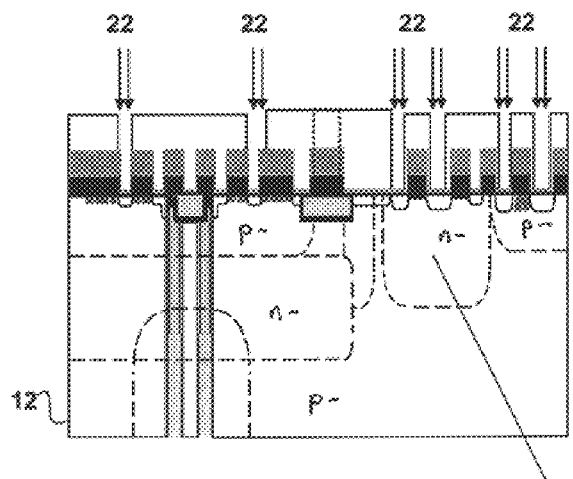

For the step of block 3 illustrated in FIG. 3, surface amorphization 22 through screen oxide is performed. Low energy inert ions are implanted, i.e., blanket implant. In-situ doping is accomplished for masked implantation using In, Sb and BF2. Non-critical implantation is accomplished by plasma doping (PLAD) or plasma immersion ion implantation (PIII). Implantation is accomplished through a sacrificial screen oxide or nitride.

Figure 4:
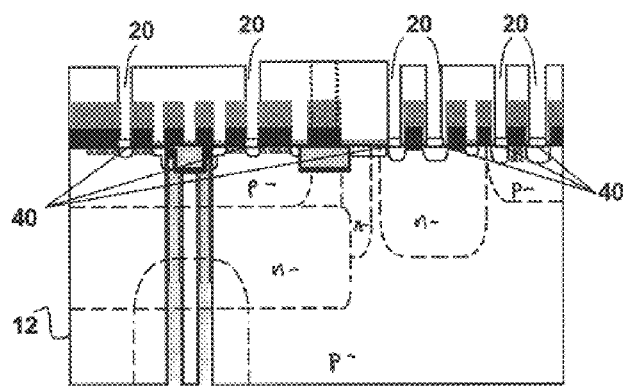

For the step of block 4 and as illustrated in FIG. 4, selective HSG/MSP growth is performed within and on the bottom of the contact window, i.e., a wet clean followed by selective amorphous-Si growth at 40. For DRAM, this has been utilized to form a high capacitance capacitor by increasing surface areas. Cluster tools are employed for in-situ cleaning, doping and capping processes. Film thickness can be controlled for an optional silicidation process integration.

Figure 5:
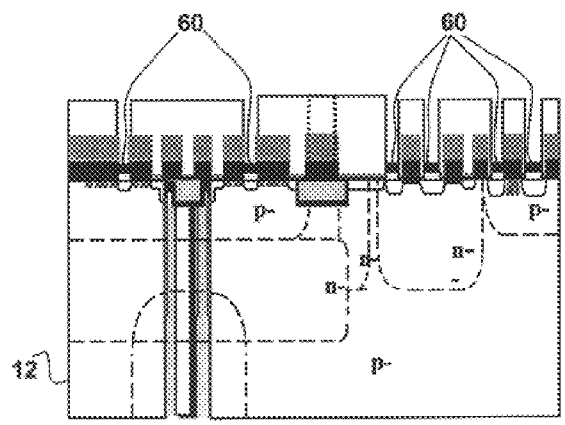

For the step of block 5 illustrated in FIG. 5, selective chemical vapor deposition (CVD) of polysilicon and tungsten (W) 60 followed by anneal for silicidation (double salicidation) is performed. $SiH_2Cl_2/WF_6$ is preferred for gate oxide reliability. Temperature and resistance is comparable to polysilicon. Grain size and thickness optimization are implemented.

Figure 6:
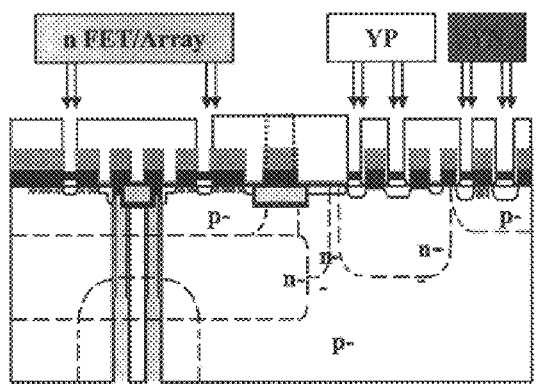

For the step of block 6 illustrated in FIG. 6, ion mixing is performed using low energy, high dose implantation by plasma doping (PLAD) or plasma immersion ion implantation (PIII) to optimize the doping conditions of NMOS and PMOS contacts. Dopants will remain within the salicidation layer for post diffusion into the junction by a silicide as doping source (SADS) method.

High energy, low dose implantation through salicidation into MS interface for better ohmic contact is also performed at this step to optimize the Shottky barrier height (SBH) on the MS interface while maintaining shallow junction contact. Ion mixing can be accomplished using various ion species. In a preferred embodiment, the energy and dose is optimized depending upon the silicidation thickness and junction depth. Sheet resistance requirements are secondary, inasmuch as low energy silicide as doping source (SADS) will be responsible for $R_C$, thus improving the process window during the implantation process. High energy, low current implantation is a well-developed area for extreme dose and energy control.

Only non-critical blocking masks are used during the step of block 6.

For the step of block 6B, an additional masking step for DRAM may be needed for an array implantation to lower the doping level.

Figure 7:
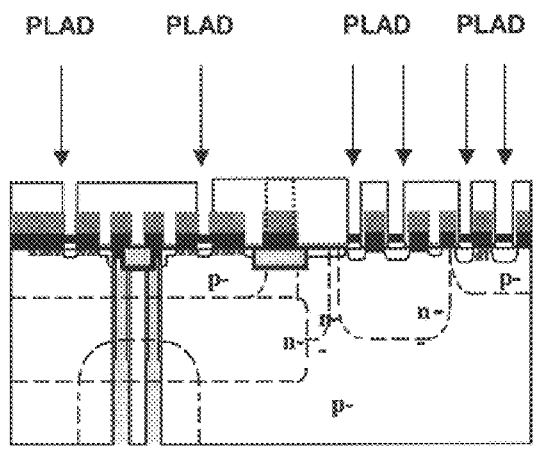

For the step of block 7 illustrated in FIG. 7, a rapid thermal processing (RTP) anneal is performed to quench off crystalline damage induced by implantation and to electrically activate dopants. A capping layer contains dopants. Diffusion through silicidation (SADS) and high doping concentration by plasma doping (PLAD) are employed in this step. Shallow junctions with low contact resistance are achieved.

Figure 8:
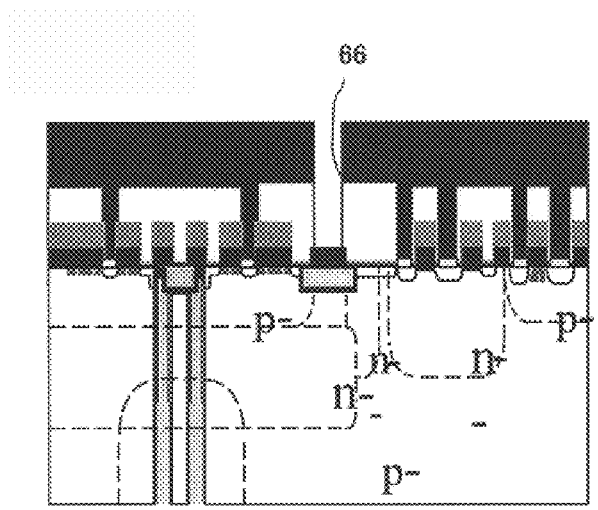

For the step of block 8 illustrated in FIG. 8, a dedicated CG etch 66 is performed. Also created is a stop on top of a metal gate (i.e., W/WN). The CG etch step provides independent optimization from the CS etch. Greater process latitude is achieved by a selective sequential etch which is insensitive to process non-uniformity.

Figure 9:
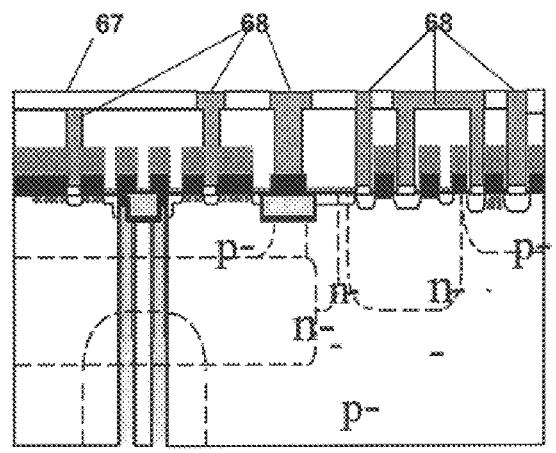
Figure 10:
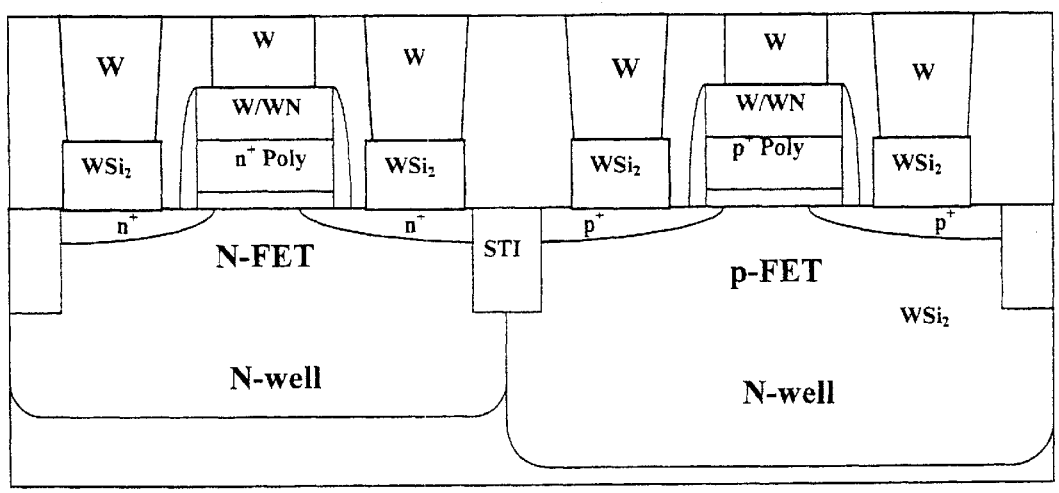
FIG. 10 shows an integrated circuit device constructed in accordance with the method of the present invention.

Finally, for the step of block 9 illustrated in FIG. 9, a metal line (e.g., M0 for DRAM) litho and etch process—local tier process is performed for a via first dual Damascene integration scheme. Ti/TiN is deposited by chemical vapor deposition (CVD) or ionized physical vapor deposition (iPVD) for a conformal barrier/adhesion layer 67. A metal fill 68, by deposition of tungsten (W), or other metal (Cu) with low-k IDL, is then followed by chemical mechanical planarization (CMP) plus a (semi-) global tier process.

An alternative preferred embodiment is illustrated in FIG. 1B, wherein steps 2A–6A replace steps 2–6 of the process flow illustrated in FIG. 1A. This alternative results in the following deviations from the steps of the preferred embodiment discussed above.

For the step of block 2A, IDL is oxide or other low-k material.

For the step of block 3A, surface amorphization is accomplished by heavy, low energy ion implantation with the ion species implanted being an insert or active species.

For the step of block 4A, hemispherical grain (HSG) size and thickness are optimized for the process.

For the step of block 5A, CVD W-deposition is preferably accomplished by diclorosilane chemistry ($SiH_xCl_s$) for gate protection against fluorine.

For the step of block 6A, ion mixing (low energy and high energy co-implantation) are accomplished with non-activating species, such as nitrogen or other metal ions, to suppress dopant diffusion or to improve the MS contact by adjusting SBH. Silicidation thickness and grain size are optimized to achieve post silicidation dopant diffusion for SADS process. The HSG grain size and thickness are also optimized to fulfill implantation conditions.

The process of the present invention integrates the conventional salicide process for logic circuits employing a W-Salicide combined with ion mixing implantation, with a self-aligned contact process for memory circuits, so that memory and logic devices fabricated together on the same wafer have low contact resistance ($R_C$), shallow contact junction depth ($X_{JC}$) and high doping concentration in the silicide contact interface ($N_C$). These are characteristics that are all essential contact requirements for CMOS devices scaled down to 150 nm node.

The present invention has applications to metal gates, dual work function devices, dual gate devices, SOI devices (both fully depleted and partially depleted), and DRAM devices having CB and CS combined together using SAC process.

While the invention has been particularly shown and described with reference to preferred embodiments thereof, it will be understood by those skilled in the art that various changes in form and details may be made without departing from the spirit and scope of the present invention.

What is claimed is:

1. A method of fabricating an integrated circuit device, having at least one type of semiconductor device and at least one gate contact contained therein, said method comprising:

providing a plurality of raised contact windows and at least one gate connector in a semiconductor substrate;

creating contact holes in said substrate by integrated etching of said substrate;

amorphizing a surface of said substrate, including said contact windows;

selectively depositing hemispherical grain layers within and on the bottoms of said amorphized contact windows;

forming a salicidation layer on said amophized contact windows by salicidation with tungsten;

implanting ions in said contact holes to optimize doping conditions for a type of semiconductor device being fabricated at said contact holes;

annealing said contact holes, whereby shallow junction contacts with low contact resistance and high doping concentration are formed in said contact holes;

performing a dedicated gate electrode etch and stop on top of a metal gate; and performing a metal line process.

2. A method of contact formation in a CMOS integrated circuit device, said method comprising:

(a) amorphizing at least one contact window of a semiconductor substrate;

(b) selectively depositing one of hemispherical grain layers and meta-stable poly within and on the bottom of said at least one contact window (c) forming a salicidation layer on said at least one contact window by salicidation with tungsten;

(d) implanting ions in said at least one contact window to optimize doping conditions for a type of semiconductor being fabricated at said at least one contact window; and (e) annealing said at least one contact window.

3. The method of claim 2 further including a step of depositing an interlevel dialectric layer and performing a S/D contact etch.

4. The method of claim 3, wherein the interlevel dialectric material is oxide.

5. The method of claim 2 further including a step of performing a dedicated gate electrode etch.

6. The method of claim 2, wherein the step of amorphizing includes implanting low energy ions via a blanket implant and in-situ doping for masked implantation using In, Sb and BF2.

7. The method of claim 2, further including optimizing grain size and thickness of the hemispherical grain layer during the step of selective growth.

8. The method of claim 2, wherein the salicidation layer is formed using dichlorosilane chemistry.

9. The method of claim 2, further including ion mixing using non-activating species.

10. The method of claim 9, wherein the non-activating species is nitrogen.

* * * * *